United States Patent
Mead et al.

(10) Patent No.: US 11,440,240 B2
(45) Date of Patent: Sep. 13, 2022

(54) METHODS AND SYSTEM FOR MASS PRODUCTION, VOLUME MANUFACTURING OF RE-ENTRANT STRUCTURES

(71) Applicant: The University of Massachusetts, Boston, MA (US)

(72) Inventors: Joey L. Mead, Carlisle, MA (US); Carol M. F. Barry, Tyngsborough, MA (US); John Shearer, Franklin, PA (US); Artee Panwar, Wilmington, MA (US); Jinde Zhang, Westford, MA (US); Nischay Kodihalli Shivaprakash, Lowell, MA (US)

(73) Assignee: THE UNIVERSITY OF MASSACHUSETTS, Boston, MA (US)

( * ) Notice: Subject to any disclaimer, the term of this patent is extended or adjusted under 35 U.S.C. 154(b) by 181 days.

(21) Appl. No.: 16/667,414

(22) Filed: Oct. 29, 2019

(65) Prior Publication Data
US 2020/0061903 A1 Feb. 27, 2020

Related U.S. Application Data

(62) Division of application No. 15/159,428, filed on May 19, 2016, now Pat. No. 10,471,646.

(60) Provisional application No. 62/163,471, filed on May 19, 2015.

(51) Int. Cl.
| | |
|---|---|
| *B29C 59/02* | (2006.01) |
| *B29C 59/04* | (2006.01) |
| *G03F 7/00* | (2006.01) |
| *B29K 101/12* | (2006.01) |
| *B29K 105/00* | (2006.01) |

(52) U.S. Cl.
CPC .......... *B29C 59/022* (2013.01); *B29C 59/04* (2013.01); *G03F 7/0002* (2013.01); *B29C 2059/023* (2013.01); *B29K 2101/12* (2013.01); *B29K 2105/256* (2013.01)

(58) Field of Classification Search
CPC ... B29C 2059/023; B29C 59/04; B29C 59/16; B29C 44/357; B29K 2101/12; B29K 2995/0093
USPC .......................................... 264/284; 425/374
See application file for complete search history.

(56) References Cited

U.S. PATENT DOCUMENTS

| | | | | |
|---|---|---|---|---|
| 6,280,670 | B1 * | 8/2001 | Buzzell | A44B 18/0049 264/146 |
| 6,991,843 | B2 * | 1/2006 | Armela | A44B 18/0049 428/120 |
| 7,416,692 | B2 * | 8/2008 | Bharadwai | B29C 35/0888 264/210.2 |

(Continued)

FOREIGN PATENT DOCUMENTS

WO 2015161233 A1 10/2015

OTHER PUBLICATIONS

Tuteja, et al., "Designing Superoleophobic Surfaces," Science, vol. 318 No. 5856 pp. 1618-162, 2007.

*Primary Examiner* — Francisco W Tschen
*Assistant Examiner* — Edgaredmanuel Troche
(74) *Attorney, Agent, or Firm* — Cantor Colburn LLP

(57) ABSTRACT

Methods and systems for manufacturing re-entrant structures, such as the structures exhibiting superomniphobic characteristic, in a continuous, well-controlled, high-rate (mass production, volume) manner are disclosed.

2 Claims, 9 Drawing Sheets

(56) References Cited

U.S. PATENT DOCUMENTS

| | | |
|---|---|---|
| 8,870,345 B2 | 10/2014 | Zhang et al. |
| 10,434,542 B2 * | 10/2019 | Dai ..................... B29C 59/022 |
| 2009/0324308 A1 * | 12/2009 | Law .................. G03G 15/2053 |
| | | 399/333 |
| 2010/0052216 A1 * | 3/2010 | Kim ....................... B82Y 10/00 |
| | | 264/284 |
| 2012/0246886 A1 | 10/2012 | Matsumoto |
| 2014/0010994 A1 | 1/2014 | Choi et al. |
| 2015/0111005 A1 * | 4/2015 | Hosomi ............... B29C 59/026 |
| | | 264/447 |
| 2016/0200953 A1 | 7/2016 | Constantinou et al. |

\* cited by examiner

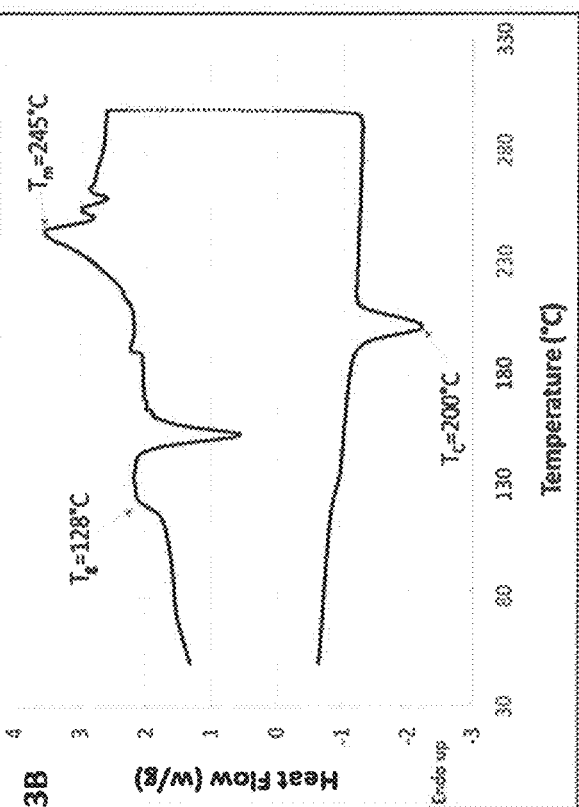
FIG. 3A
FIG. 3B
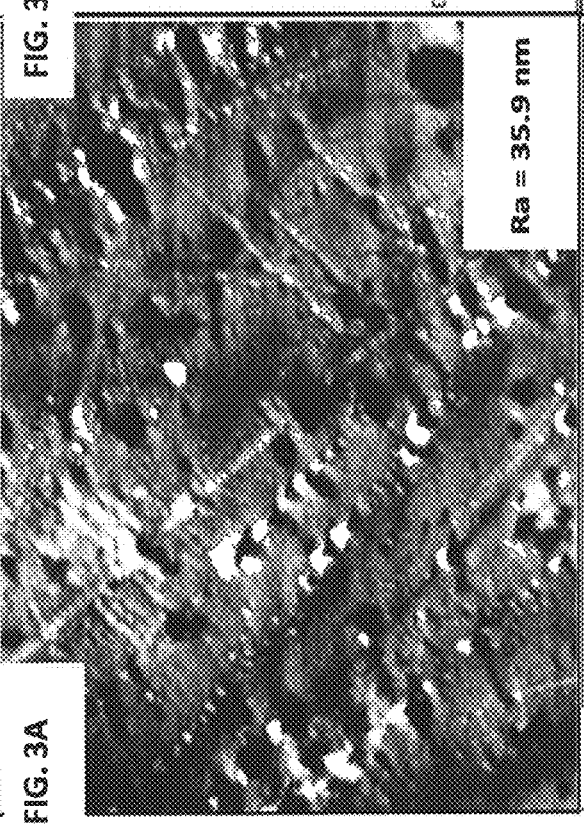
FIG. 3C
FIG. 3D
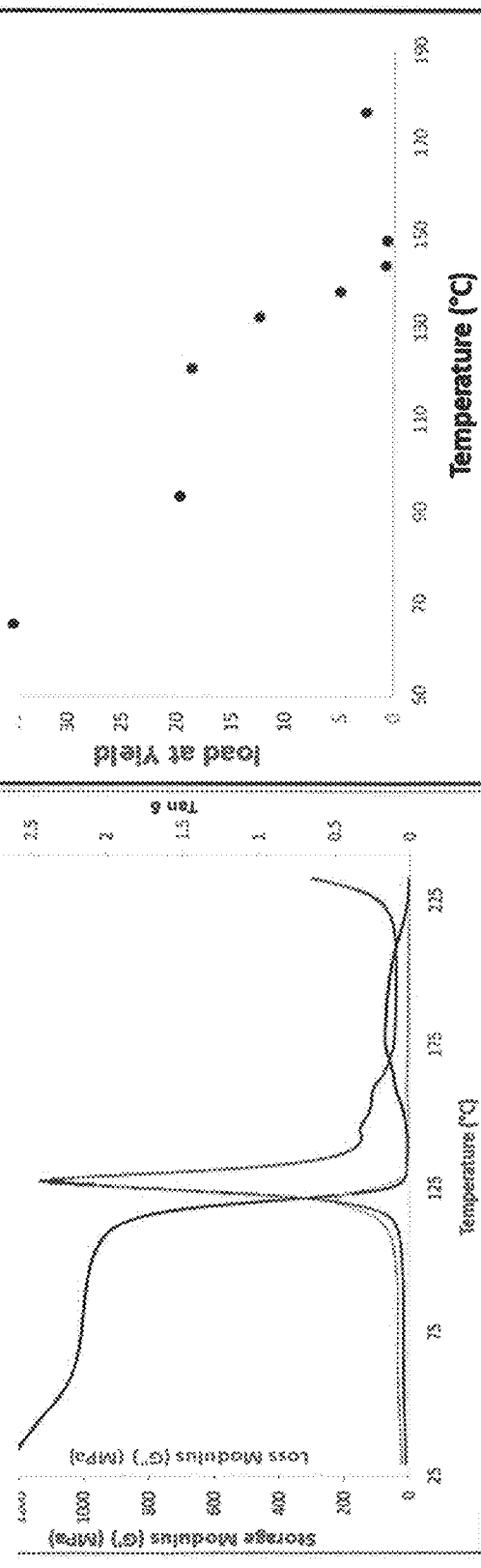

METHODS AND SYSTEM FOR MASS PRODUCTION, VOLUME MANUFACTURING OF RE-ENTRANT STRUCTURES

CROSS REFERENCE TO RELATED APPLICATIONS

This application is a divisional of U.S. patent application Ser. No. 15/159,428, entitled METHODS AND SYSTEM FOR MASS PRODUCTION, VOLUME MANUFACTURING OF RE-ENTRANT STRUCTURES, filed on May 19, 2016, and which claims priority to and benefit of U.S. Provisional Application No. 62/163,471, filed May 19, 2015, entitled CREATING RE-ENTRANT STRUCTURES BY COMPRESSING CYLINDRICAL PILLARS IN THE ROLL TO ROLL PROCESS, which is incorporated by reference herein in its entirety for all purposes.

STATEMENT REGARDING FEDERALLY SPONSORED RESEARCH OR DEVELOPMENT

This invention was made with U.S. Government support from the National Science Foundation under the Nanoscale Science and Engineering Centers program under Award: NSF-0832754. The U.S. Government has certain rights in the invention.

BACKGROUND

These teachings relate generally to fabrication of re-entrant structure, and, more particularly, to mass production, high volume manufacturing of re-entrant structures.

Re-entrant structures are used in a number of applications. Among the better-known applications is the use of re-entrant structures in superomniphobic (including superoliophobic) and biomimetic surfaces.

Superoleophobic surfaces are characterized by having a contact angle of 150° or greater with an oil droplet. Preparation of these surfaces is more difficult compared to superhydrophobic surfaces because of the low surface energy of most oils. It is also challenging to fabricate a superomniphobic solid surface, which is defined as a surface with high contact angle (CA) (>150° and low small contact angle hysteresis (CAH) (<10° not only with water but also with a wide range of liquids such as oils and organic solvents. Superomniphobic solid surfaces can be used in various applications such as inkjet printing, xerography, home appliances, antifouling coatings for surfaces such as ship hulls, antifingerprint films, solar panels, and safely googles.

Since break-through theory and works achieved by Cohen's group in MIT about how to design robust superomniphobic surfaces was reported, more and more attractions are paid to superomniphobic surfaces. To address this challenge, Cohen's group designed and built special textures possessing overhangs or re-entrants with well-defined geometries on solid surface. Cohen's group indicated that as long as the re-entrant angle is smaller than $\theta_Y$, such overhang or re-entrant surface structures are able to pin the solid-liquid contact line and keep a composite interface under droplet. In this case, convex meniscus of liquid droplet will generate a net force upward to prevent the droplet from penetrating into grooves to have completely contact with solid and support the whole droplet stand on top of textures. This state was called metastable Cassie state. As long as metastable Cassie state is kept, Cassie-Baxter model dominates the wetting behavior of solid surface. A similar strategy to making superhydrophobic surfaces can be used here to make superomniphobic surfaces. This discovery points out the possibility to alter a surface wetting behavior from nonrepellency to highly repellency. There is still a challenge in how to make such re-entrant structures. After this theory, a number of studies have been published on developing different types of re-entrant structure by various methods. These methods can be generally classified into two categories, including (1) top-down methods, such as photolithography followed by selective etching of Si to create micro-hoodoos, replica molding of mushroom-like micropillar arrays with flat tops and inverse-trapezoidal microstructures, and (2) self-assemblies such as spray coating of fluoroalkyl-functionalized silica and silica nanoparticles, electrospinning of fibers, in situ formation of dual-scale particles on woven fibers, and creating stochastic surface topography or fractal structures with high curvatures via templating. While the re-entrant, mushroom-like structures can be precisely fabricated by top-down approaches, fabrication often involves multistep fabrication, which is nontrivial, laborious, and costly. Self-assembly is simple and covers large areas; however, it is difficult to precisely control the morphology that could repel oil.

There is therefore a need for an approach to manufacture surface special textures or roughness in an easy, high-rate, well-controlled, massive-production manner.

In recent years, micro hot embossing has been regarded as one of the most popular and cost effective method of fabricating microscale and nanoscale features on a polymer substrate. Owing to the capability of replicating features with high fidelity and accuracy, micro hot embossing using plate-to-plate (P2P) mode has received a wide spread attention both in academia and industry. Despite all the advantages, micro hot embossing on a P2P mode is generally coupled with the drawbacks of limited efficiency, larger forming load and small area of replication. As a result, demand for continuous micro hot embossing on large area polymeric substrates has increased. Embossed polymeric substrates comprising micro and nanoscale features are widely used in the area such as organic solar cells, flexible displays, biomedical devices, etc.

Nanoimprint lithography (NIL) is an established technique for fabricating three-dimensional features at the micro and nanoscales with some processes achieving feature replication as small as 5 nm. There are two broad types of NIL: thermal (T-NIL, also referred to as hot embossing lithography) and light-cured (P-NIL or UV-NIL). Both variations utilize tooling, referred to as a stamp or a mold, to replicate features into a surface that are then de-molded. In the case of T-NIL, a thermoplastic material such as PMMA is heated above the glass transition temperature to allow the material to conform to the mold under pressure. With P-NIL, a liquid system, typically PDMS, is cured against the tool to form features. When compared to other techniques to generate micro and nanoscale features, NIL processes offer several benefits. There are smaller operating costs when compared to photolithography or electron-beam lithography as there are no photomasks, resists, lasers, or vacuum. The process is inherently three-dimensional, fast, and high-resolution. Most thermoplastic and thermoset materials can be used in NIL processes, although the best results are obtained with amorphous thermoplastics and UV-curable thermosets. There are fewer internal stresses and lower flow rates associated with micro and sub-microscale T-NIL of thermoplastics when compared to other thermoplastic processing techniques.

There is a desire for materials to have a low zero-shear-rate viscosity for the imprinting deformation and a high enough tensile modulus to survive de-molding. When considering a high-rate continuous process, either the material will need to be carefully considered to have the right rheological properties for isothermal feature formation, or the process will have to be designed with heating and then cooling not unlike traditional thermoplastic processing methods. Good results have been reported for T-NIL when thermoplastics are at or above the glass transition temperature ($T_g$) for feature creation and below $T_g$ for de-molding. The molecular weight of the material may be used to tune the $T_g$ of the material with decreasing molecular weight corresponding to decreasing $T_g$. Lowering the molecular weight may also decrease the mechanical properties of the features which will complicate de-molding.

Currently, several high-volume, but discontinuous NIL devices are available for production. Continuous T-NIL and P-NIL processing has been produced features as small as 70 nm. In general, the process tradeoffs for using T-NIL with thermoplastics are pressure, temperature, film thickness, and feature height.

Significant amount of research has been made in the field of hot embossing and roll-to-roll (R2R) embossing in general. Several studies provided insights on several parameters that could possibly influence replicated features in terms of its accuracy and fidelity[i]. However, this technique cannot be directly used to replicate/transfer structures with undercuts because it is impossible to separate such transferred patterns from master mold after cooling. Unfortunately, all the re-entrant or re-entrant structures have undercuts.

There is therefore a need for an approach to manufacture re-entrant structures, such as the structures exhibiting superomniphobic characteristic, in a continuous, well-controlled, high-rate manner.

BRIEF SUMMARY

Methods and systems for manufacturing re-entrant structures, such as the structures exhibiting superomniphobic characteristic, in a continuous, well-controlled, high-rate (mass production, volume) manner are presented hereinbelow.

In one or more embodiments, the method of these teachings for mass production, volume manufacturing of re-entrant structures includes moving an array of non-curable thermoplastic pillars protruding from a substrate through a gap between two rollers, motion of the array and the substrate caused by relative rotation of the two rollers configured to draw the array and the substrate through the gap; direction of the motion through the gap being hereinafter referred to as lengthwise, the array of non-curable thermoplastic pillars comprising structures disposed along a lengthwise direction, creating, while moving, a temperature gradient from a surface of the non-curable thermoplastic pillars disposed farthest away from the substrate to a surface of the substrate, a temperature at the surface of the non-curable thermoplastic pillars disposed farthest away from the substrate being the temperature at which a non-curable thermoplastic material of the non-curable thermoplastic pillars is substantially malleable, applying, while moving, a pressure on the surface of the non-curable thermoplastic pillars disposed farthest away from the substrate; the pressure and the temperature at the surface of the non-curable thermoplastic pillars disposed farthest away from the substrate selected to cause irreversible deformation of the non-curable thermoplastic material; whereby the re-entrant structure is formed. A clean room environment is not necessary for these embodiments of the method of these teachings.

A number of other embodiments of the method and system of these teachings are also disclosed.

For a better understanding of the present teachings, together with other and further needs thereof, reference is made to the accompanying drawings and detailed description and its scope will be pointed out in the appended claims.

BRIEF DESCRIPTION OF THE DRAWINGS

FIGS. 3a-3d show measured material properties of a polymer sheet in an exemplary embodiment of these teachings;

DETAILED DESCRIPTION

Figure 1:
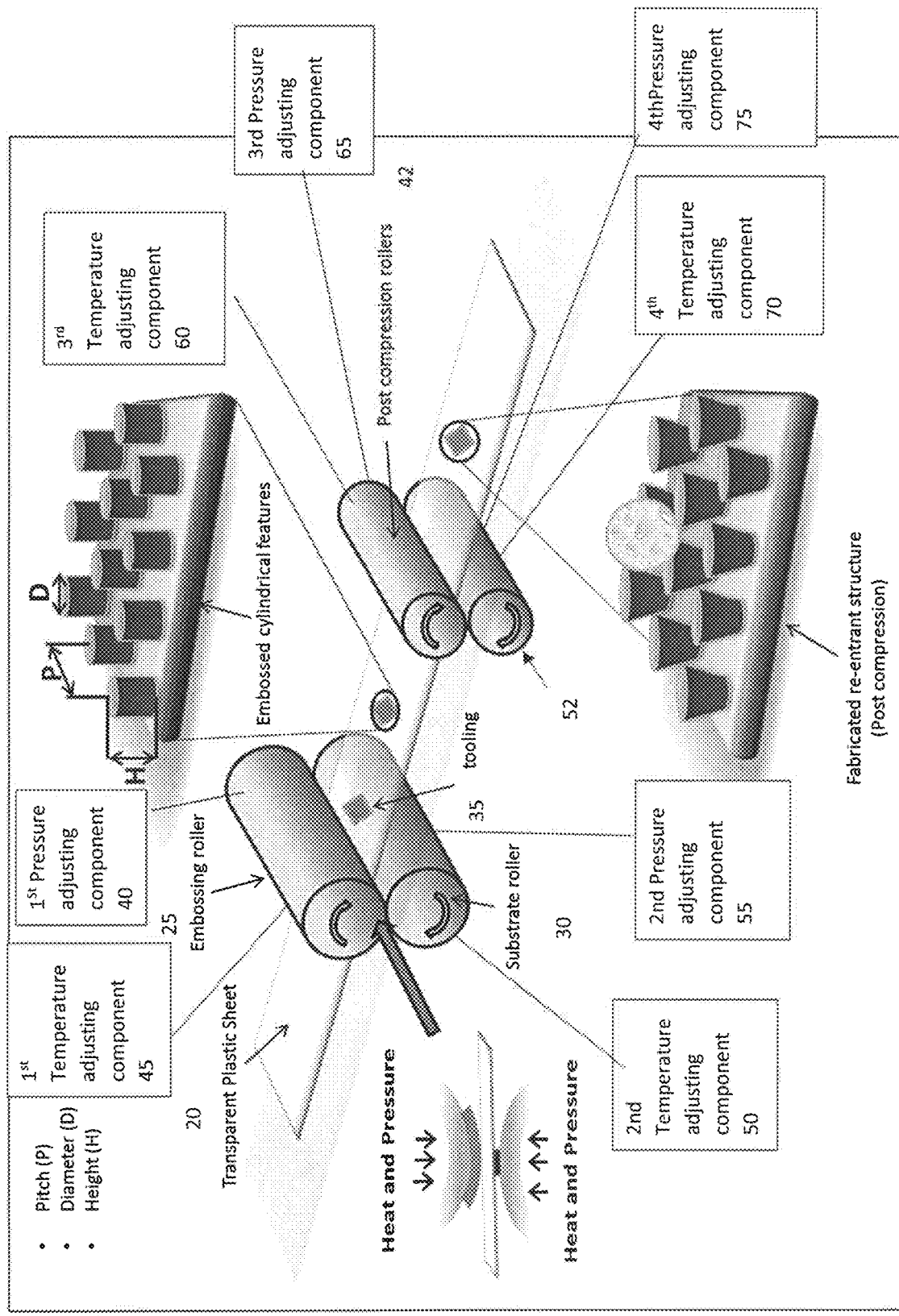
FIG. 1 shows one embodiment of the system of these teachings.

Methods and systems for manufacturing re-entrant structures, such as the structures exhibiting superomniphobic characteristic, in a continuous, well-controlled, high-rate (mass production, volume) manner are presented hereinbelow.

The following detailed description presents the currently contemplated modes of carrying out the invention. The description is not to be taken in a limiting sense, but is made merely for the purpose of illustrating the general principles of the invention, since the scope of the invention is best defined by the appended claims.

As used herein, the singular forms "a," "an," and "the" include the plural reference unless the context clearly dictates otherwise.

"Non-curable," as used herein, refers to a polymer that does not change irreversibly due to curing.

"Design parameters for superoleophobicity," as used herein, refer to the robustness parameter (H*) and of the spacing ratio (D*) defined in Tuteja, Anish, Wonjae Choi, Minglin Ma, Joseph M. Mabry, Sarah A. Mazzella, Gregory C. Rutledge, Gareth H. McKinley, Robert E. Cohen. "Designing Superoleophobic Surfaces," Science 2007, Vol. 318 no. 5856 pp. 1618-162 and in Anish Tuteja, Wonjae Choi, Gareth H. McKinley, Robert E. Cohen, and Michael F. Rubner, "Design Parameters for Superhydrophobicity and Superoleophobicity," MRS BULLETIN, VOLUME 33, AUGUST 2008, both of which are incorporated by reference herein in their entirety and for all purposes.

In one or more embodiments, the method of these teachings for mass production, high volume manufacturing of re-entrant structures includes moving an array of non-curable thermoplastic pillars protruding from a substrate through a gap between two rollers, motion of the array and the substrate caused by relative rotation of the two rollers configured to draw the array and the substrate through the gap; direction of the motion through the gap being hereinafter referred to as lengthwise, the array of non-curable thermoplastic pillars comprising structures disposed along a lengthwise direction, creating, while moving, a temperature gradient from a surface of the non-curable thermoplastic pillars disposed farthest away from the substrate to a surface of the substrate, a temperature at the surface of the non-curable thermoplastic pillars disposed farthest away from the substrate being the temperature at which a non-curable thermoplastic material of the non-curable thermoplastic pillars is substantially malleable, applying, while moving, a pressure on the surface of the non-curable thermoplastic pillars disposed farthest away from the substrate; the pressure and the temperature at the surface of the non-curable thermoplastic pillars disposed farthest away from the substrate selected to cause irreversible deformation of the non-curable thermoplastic material; whereby the re-entrant structure is formed. A clean room environment is not necessary for these embodiments of the method of these teachings.

In one classification, thermoplastics are differentiated into amorphous thermoplastics and semicrystalline thermoplastics. For amorphous thermoplastics, below the glass temperature $T_g$, the mechanical properties are barely flexible and brittle; however, after exceeding the glass temperature, and the thermoplastic becomes soft elastic and upon reaching the flow temperature ($T_f$), the thermoplastic enters into the molten phase. For semicrystalline thermoplastics, above the glass temperature, the mechanical behavior of the material is between tough elastic to hard; however, above the crystal melt temperature $T_m$, the material becomes malleable. Since, in the present teachings, pressure is applied in order to cause irreversible deformation, the thermoplastic material can be soft elastic or tough elastic but close to malleable and irreversible deformation would be obtained. Since the state of the thermoplastic is near malleable, substantially malleable includes those states where the thermoplastic is soft elastic or tough elastic but close to malleable and irreversible deformation can be obtained by the application of pressure (for semicrystalline thermoplastics, that includes temperatures between the glass temperature and the melt temperature) (see chapter 1, Material Properties of Plastics, in Laser Welding of Plastics: Materials, Processes and Industrial Applications, published online Oct. 17, 2011, which is incorporated by reference herein in its entirety and for all purposes).

In one instance, the temperature gradient is formed by heating a roller from the two rollers, the roller being in contact with the surface of the non-curable thermoplastic pillars disposed farthest away from the substrate, to a first temperature while maintaining another roller from the two rollers, the another roller being in contact with the substrate, at a second temperature; a ratio of the first temperature to the second temperature being such that the material of the non-curable thermoplastic pillars is substantially malleable.

In another instance, the substrate is of a same material as the array of non-curable thermoplastic pillars. In that instance, the array of non-curable thermoplastic pillars is formed by moving a sheet of the non-curable thermoplastic material through a gap between two primary rollers, motion of the sheet caused by relative rotation of the two primary rollers configured to draw the sheet through the gap, providing a predetermined pressure between two primary rollers such that the sheet of the non-curable thermoplastic material is contact with one primary roller, a flexible mold being disposed on the one primary roller, the flexible mold having an array of apertures and a predetermined thickness, and heating at least the one primary roller such that a surface of the sheet of the non-curable thermoplastic material is heated to a temperature at which nonuniform flow is produced.

In one embodiment, the other primary roller is also heated, where a ratio between a lower temperature roller and a higher temperature roller, the higher temperature roller being the one primary roller having the flexible mold, is selected such that nonuniform flow is produced in the non-curable thermoplastic material. In one instance, a portion of the sheet of the non-curable thermoplastic material is preheated to a predetermined temperature before moving through the gap.

In another embodiment, the sheet of the non-curable thermoplastic material is a flexible sheet disposed in a film roll and is configured to be provided to the primary rollers and said two rollers in a continuous matter such that continuous roll-to roll processing for forming the array of non-curable thermoplastic pillars and the re-entrant structures.

The above disclosed embodiments of the method of these teachings can result in a method for mass production, volume manufacturing of superoleophobic surfaces when dimensions of the array of non-curable thermoplastic pillars and the pressure and the temperature at the surface of the non-curable thermoplastic pillars selected such that parameters of the re-entrant structures result in design parameters for superoleophobicity that correspond to superoleophobic surfaces.

Figure 2:
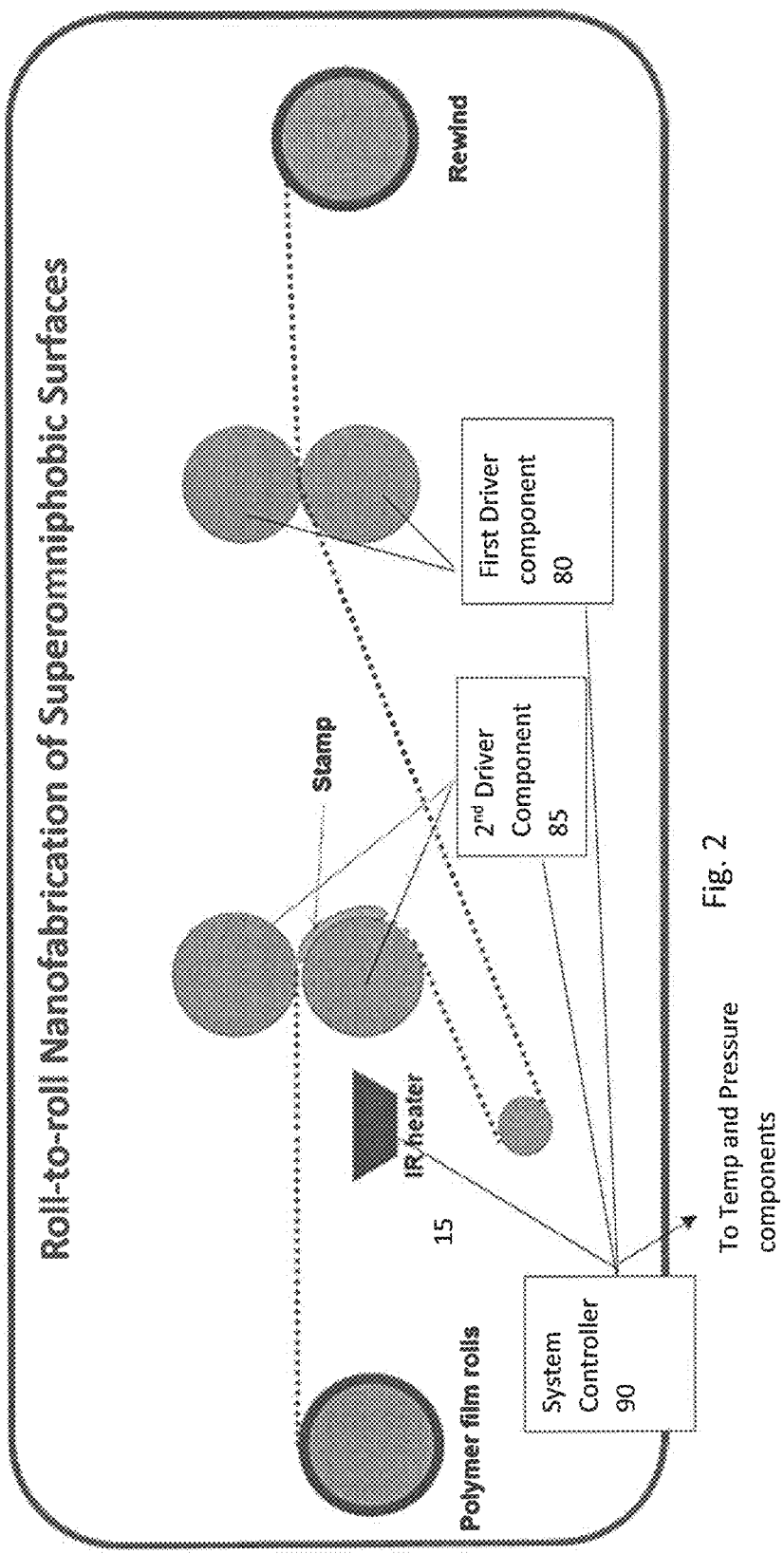
FIG. 2 is shows a schematic representation of an embodiment of a roll-to-roll process of these teachings.

One embodiment of the method and system of these teachings is are illustrated in FIGS. 1 and 2. Extruded polymer sheet (fabricated in-house in one instance) passes over an IR preheater 15 where the sheet is preheated to a certain (predetermined) temperature before contacting with primary rolls set. The primary rollers 25, 30 are responsible for hot embossing. Top roller 25 is called press roll, in one embodiment comprising a rubber cover, in order to achieve uniform pressing. Bottom roller 30 is called pattern roller, where flexible master mold 35 is mounted. Both rollers' temperature and pressure can be controlled by the temperature adjusting components 45, 50 and the pressure adjusting components 40, 55. The flexible master mold used in one instance, not a limitation of these teachings, is a 200-um thick Ni shim with pattern on that. In one exemplary embodiment, the pattern is square array of holes with 200 nm diameter (D), 400 nm height (H) and 400 nm center-to-center space (P); in another exemplary embodiment, the pattern is 15 μm diameter (D), 15 μm height (H), and 45 μm center-to-center space (P) (it should be noted that these teachings are not limited to the exemplary embodiments). Thus, replicated features on polymer film should be square array of "pillars" with same parameters. After hot embossing, film will continue moving to next step called "polymer yielding (mushing)." Polymer yielding is performed on patterned film surface via secondary rolls set 42, 52. The force, temperature and speed of rolls can be controlled by the temperature adjusting components 70, 60 and the pressure adjusting components 65, 75 and by a system controller 90 (FIG. 2). Under proper "polymer yielding" conditions, pillars experienced irreversible deformation across the height, resulting in re-entrant (in one instance, inverted trapezoidal) structure. Such structure has been proven to be able to repel both water and oil and exhibit superomniphobic characteristics.

Figure 9:
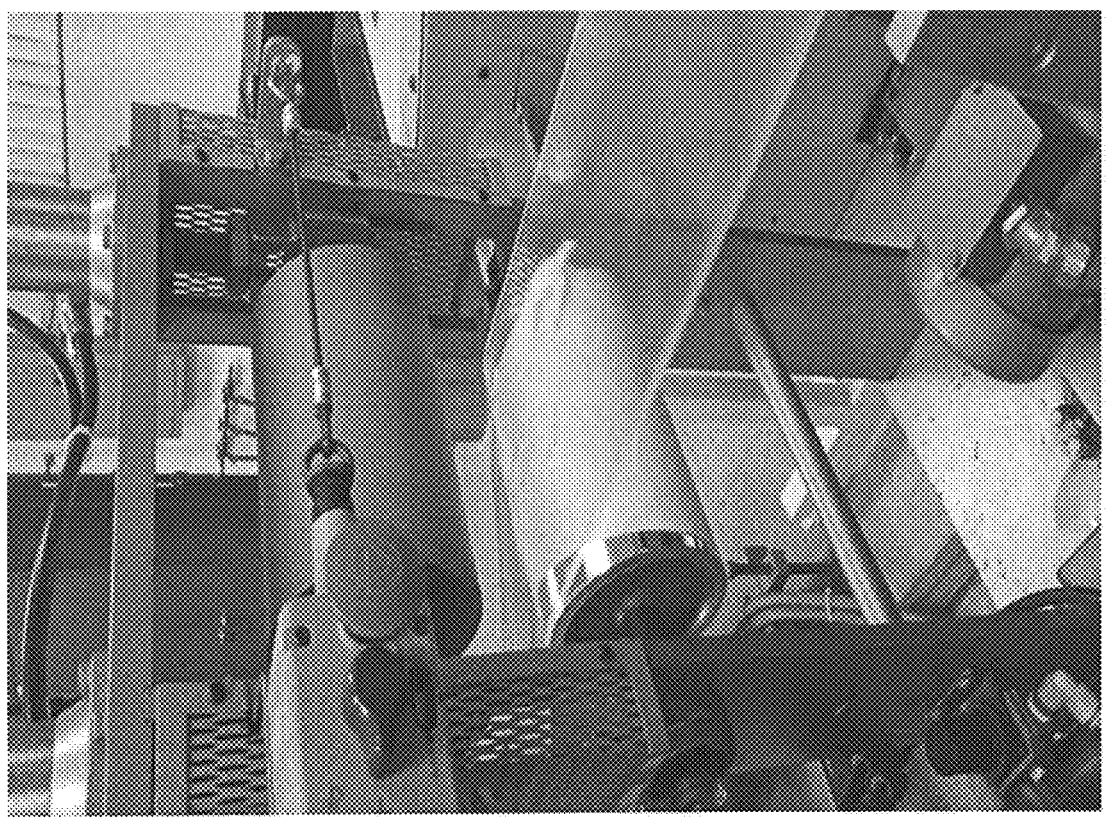
FIG. 9 is a graphical pictorial representation of one embodiment of the system of these teachings.

A graphical pictorial representation of one embodiment of the system of these teachings is shown in FIG. 9. The pressure adjusting components 60, 65 or 40, 55 can be configured by a compressive approach where the first and second pressure adjusting components 40, 55 (or the third and fourth pressure adjusting components 65, 75) operates through actuators and drive components to provide compression. Other approaches are possible, for example, increasing the weight of one roller. The temperature adjusting components 70, 60 or 45, 50 can be configured by use of electrical heating elements or other ways of transferring heat such as convection or radiation. The driver components 80, 85 are configured by motors and rotation transferring components such as gears or pulleys and belts. The system controller 90 typically includes a processor and non-transitory computer readable medium that has the computer readable code that, when executed by the processor, causes the processor to provide the control signals.

In order to further elucidate these teachings, an exemplary embodiment is presented herein below. It should be noted that these teachings are not restricted to or by the exemplary embodiment.

Exemplary Embodiments

Characterizations

Differential Scanning calorimetry (DSC)

Glass transition temperature (Tg) of Trogamid sheet was determined using differential scanning calorimetry (DSC) (Q2000 series-TA Instruments). A very small amount (5.8 mg) of sample was cut and placed in one of the two aluminum pans, while the other empty pan was used as reference. Analysis was performed in standard mode with a heating rate of (10° C./min) and cooling rate (5° C./min). The resulting thermograph from the analysis is shown in FIG. 3b.

Dynamic Mechanical Analysis (DMA)

Dynamic mechanical analysis (DMA) was performed using (Q800 series-TA Instruments) in a tensile mode. The frequency was set at 1 Hz and temperature was varied from room temperature to the melting point of the polymer. Samples with 7.08 mm width, and 0.25 mm thickness were used for the testing and the variation of storage modulus (G') and loss modulus (G") vs temperature (° C.) was measured (FIG. 3c).

Dynamic Shear Viscosity

The objective is to investigate the rheological behavior of the polymer at relatively higher temperature (above $T_g$). The shear viscosity as a function of temperature was obtained using a cone and plate rheometer (HAAKE Mars III, Thermo Scientific), with a diameter of 35 mm and an angle of 1°. A polymer sample amount of 0.4 ml was used in the measurement. A gap of 0.104 mm was maintained between the cone and the plate geometries. Flow curves were measured by increasing the shear stress with regular steps and waiting for equilibrium at each step. The polymer sample was placed on the plate surface and heated for 30 min before the test in order to achieve homogeneous temperature distribution. The shear rate was varied between 0.01 s$^{-1}$ and 100 s$^{-1}$. Resulting shear viscosity vs temperature curves are shown in FIG. 3d.

Tensile Testing

Tensile testing was carried out using an Instron testing equipment (4481) coupled with an environmental chamber (control test chamber) to study the polymer yielding mechanism with respect to temperature. Analysis was performed based on the guidelines provided by ASTMD 638. Detailed parameters of the testing are listed in Table 1.

TABLE 1

Detailed description of tensile testing

| Description | Value |
| --- | --- |
| Sample dimensions (inch) | Length - 1"<br>Width - 0.04"<br>Thickness - 0.01" |
| Cross head speed (inch/min) | 20 |
| Temperature zone (° C.) | 65-175 |

FIGS. 3a-3d show measured material properties of Trogamid sheet (a) atomic force microscopy (AFM) image illustrating surface roughness value (Ra=35.9 nm), (b) differential scanning calorimetry (DSC) thermograph indicating glass transition temperature ($T_g$) of 285° F., (c) dynamic mechanical analysis (DMA) results showing variation of storage modulus (G') and loss modulus (G") vs temperature (° C.) and (d) Dynamic shear viscosity (Pa-s) vs temperature (° C.) curve from rheological analysis.

Contact Angle Measurement

Deionized water droplet (5 μl) was deposited on the polymer sheet containing re-entrant structures which were fabricated via polymer yielding (mushing). Static contact angle was measured by taking images using drop shape analysis system (DSA 100, Krauss GmbH). Reported contact angles were measured and averaged over three different spots.

Field-Emission Scanning Electron Microscopy (FE-SEM)

Fabricated micron sized pillar structures and re-entrant structures were characterized using field-emission scanning electron microscopy (FE-SEM) (JEOL JSM 7401F). Accelerating voltage of 10 KV was used to image all the samples. A working distance of 28 mm and 60° stage tilt were used throughout the study.

Fabrication of Micron Sized Pillar Structure Via Hot Embossing

Roll-to-Roll hot embossing of polymers is primarily influenced by patterning time ($t_{pattern}$), tool temperature ($T_{tool}$), rubber roller temperature ($T_{rubber\ roll}$) and pressure (P). A detailed investigation was performed to find out influence of embossing temperature ($T_{tool}$), and pressure (P) on height of replication. Details are listed in Table 2.

TABLE 2

Embossing parameters used to study the influence of temperature and pressure on height of replication.

| Trial | $T_{tool}$ (° F.) | $T_{Rubber}$ (° F.) | P (psi) | $t_{pattern}$ (s) |
| --- | --- | --- | --- | --- |
| 31-D-4 | 315 | 280 | 60 | 20 |
| 31-D-3 | 330 | | 60 | |
| 31-D-2 | 350 | | 80 | |
| 31-D-1 | 350 | | 60 | |
| 28-D-3 | 375 | | 60 | |
| 28-D-2 | 390 | | 60 | |
| 28-D-1 | 415 | | 60 | |

Fabrication of Micron Sized Pillar Structure Via Hot Embossing

Figure 4:
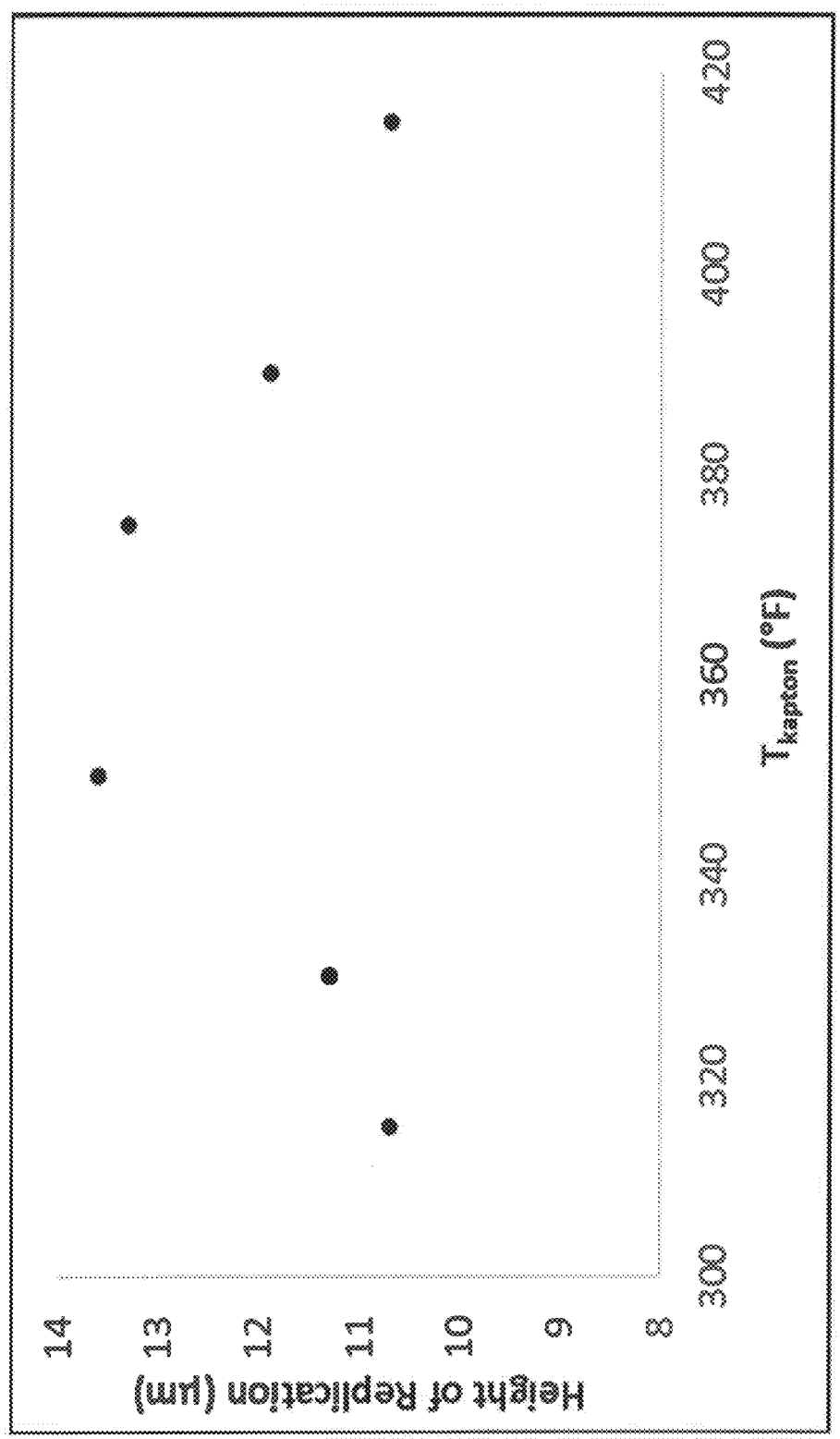
FIG. 4 is a graphical representation of results from one exemplary embodiment of the method and system of these teachings.
Figures 5A, 5B, 5C, 5D, 5E, 5F, 5G:
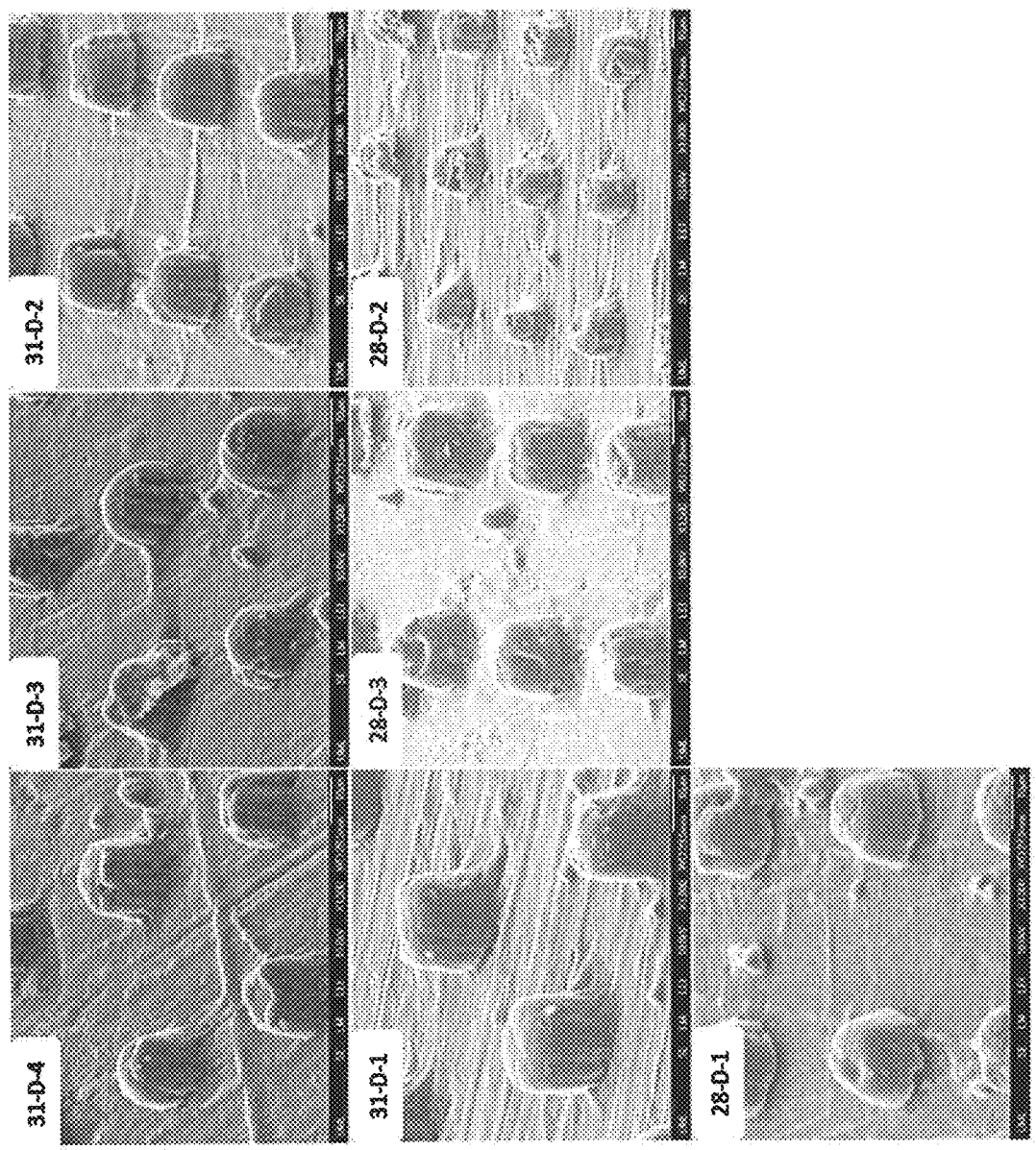
FIGS. 5a-5g show SEM images illustrating the influence of embossing temperature on the height of replication (μm) for an exemplary embodiment of these teachings.

As shown in FIG. 4, height of replication increases with tooling temperature ($T_{tool}$) up to 350° F. (31-D-1). This can be attributed to the increase in viscous flow property allowing polymer to flow freely into micro cavities of the tooling. However, at higher tooling temperature ($T_{tool}$) beyond (31-D-1) height of replication decreased. This can be explained based on the phenomenon of squeeze flow. As illustrated in FIG. 3d, significant reduction in viscosity is observed at higher temperatures beyond 350° F. As a result, polymer deformation mode may undergo a transformation from shear flow based cavity filling to a lateral squeeze flow resulting in increased fill time.

FIG. 4 shows Graphs illustrating the Influence of embossing temperature ($T_{tool}$) on height of replication (μm) (Note: Values reported for height of replication are the average of 6 feature heights at different regions of embossed sample).

Field-emission scanning electron microscopy (FE-SEM) images (FIGS. 5a-5g) are also in good agreement with the observed phenomenon suggesting reduction in height of replication beyond 350° F.

Fabrication of Re-Entrant Structures Via "Polymer Yielding"

Re-entrant structure can be achieved via polymer yielding by attaining temperature gradient across the height of micron sized pillar structures. Various processing parameters of polymer yielding are investigated to find out influence on geometry angle of pillars (Ψ). More details about the polymer yielding process are listed in Table 3.

TABLE 3

Process parameters used to study the influence of polymer yielding on geometry angle of pillars.

| Trial | $T_{steel}$ (° F.) | $T_{Rubber}$ (° F.) | P (Psi) | $V_{roll}$ (ft/min) |
|---|---|---|---|---|
| 11-J-2 | 250 | 73 | 10 | 10 |
| 11-J-3 | 300 | | 10 | |
| 11-J-4 | 330 | | 10 | |
| 13-J-2 | 300 | | 20 | |
| 13-J-3 | 300 | | 25 | |
| 13-J-4 | 300 | | 30 | |
| 13-J-5 | 330 | | 5 | |

Fabrication of Re-Entrant Structures Via "Polymer Yielding (Mushing)"

Figure 6:
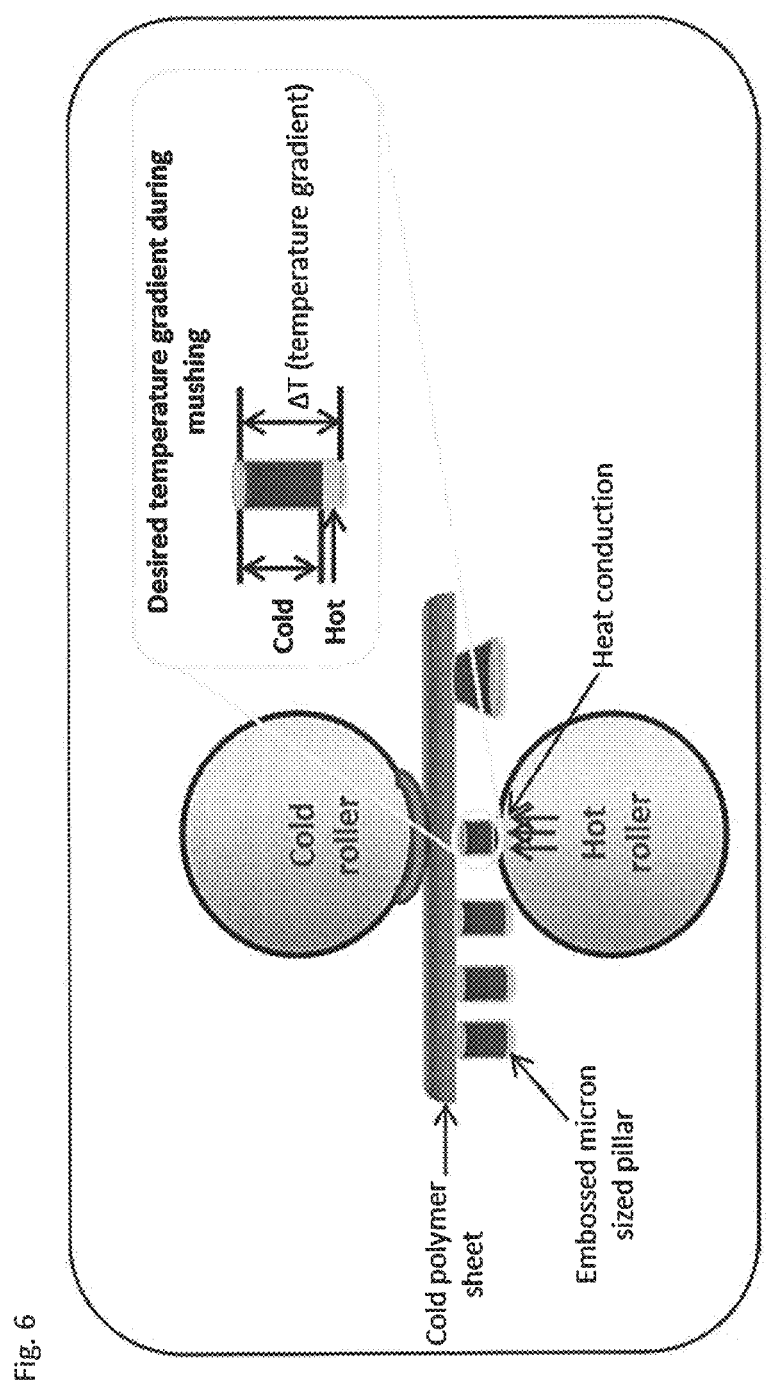
FIG. 6 is a schematic representation of one embodiment of the method of these teachings.

In order to fabricate re-entrant structures via polymer yielding (mushing), an understanding of mechanical behavior of polymers with respect to temperature plays a significant role. In general, instantaneous elastic deformation and creep strain are the two types of deformations observed during roll-to-roll process. Creep strains have a tendency to develop rapidly beyond $T_g$ leading to larger irreversible deformation. Similarly, yield strength of polymer varies with temperature and strain rate. Briefly, the yield strength of a polymer decreases at higher temperature or lower strain rates and vice-versa. This concept has been utilized to restrict irreversible deformation (polymer yielding) only to the top portion of embossed micron sized pillar structures. Hence, temperature distribution across the height of the micron or nanosized pillar structures plays a significant role. In other words, the hotter top portion of the pillar (beyond $T_g$) inherently possess lower yield strength values relative to the rest of pillar kept at lower temperature. On application of pressure (P) via the rollers, hot top portion with a lower yield strength value undergoes a localized irreversible deformation (polymer yielding) leading to fabrication of the re-entrant structures. A schematic illustration of the polymer yielding (mushing) process and desired temperature distribution across the height of the micron or nanosized pillar structures is illustrated in FIG. 6.

Temperature gradient across the height of micron or nanosized pillar structures can be achieved by keeping the steel roller at higher temperature (around Tg) while the rubber roller maintained at room temperature. Moreover, temperature gradient is controlled by contact time (roll speed) and pressure (P).

Figure 7:
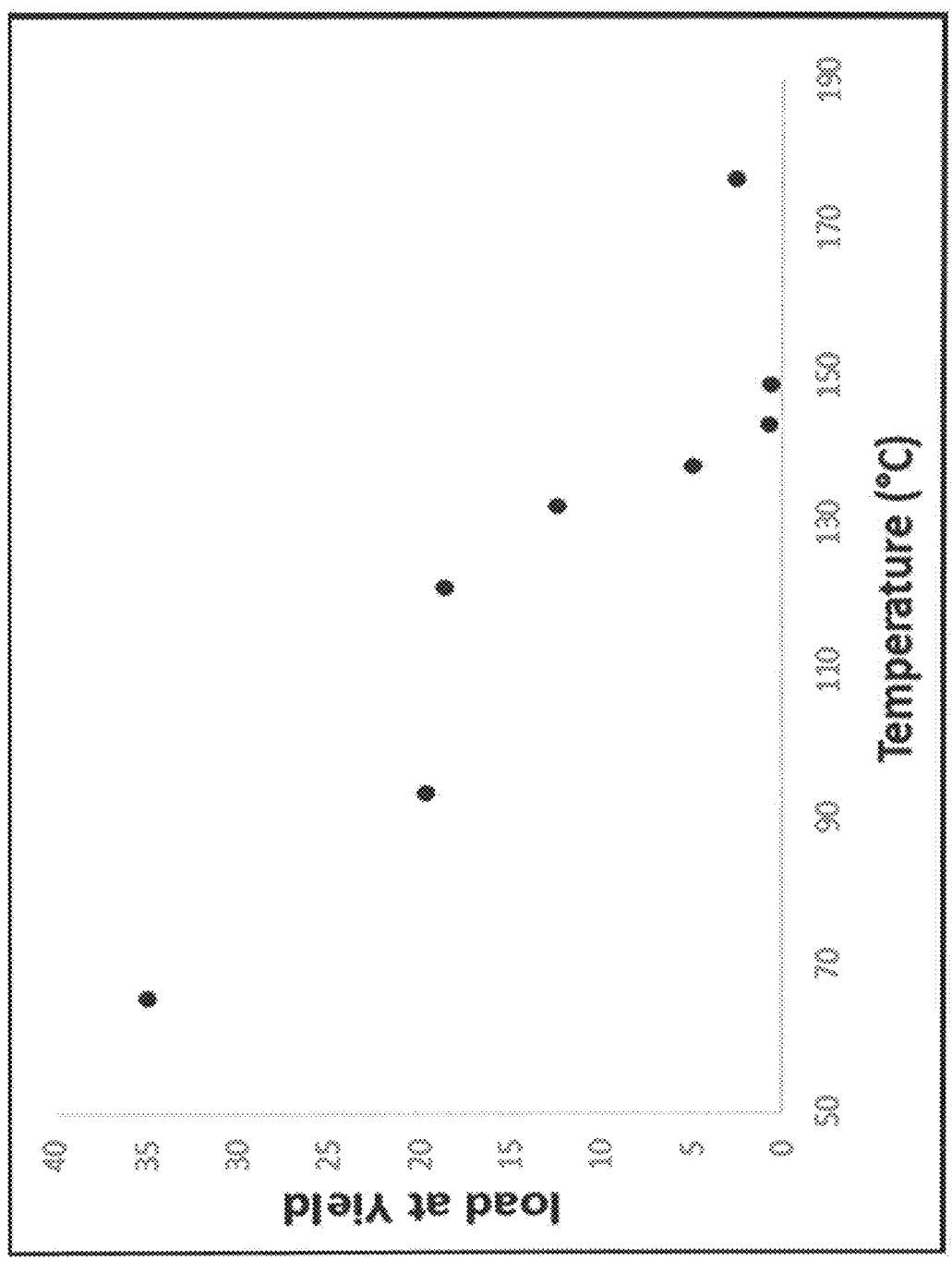
FIG. 7 is a graphical representation of the load at yield (psi) vs. temperature (° C.) for an exemplary embodiment of these teachings.
Figures 8A, 8B, 8C, 8D, 8E, 8F, 8G:
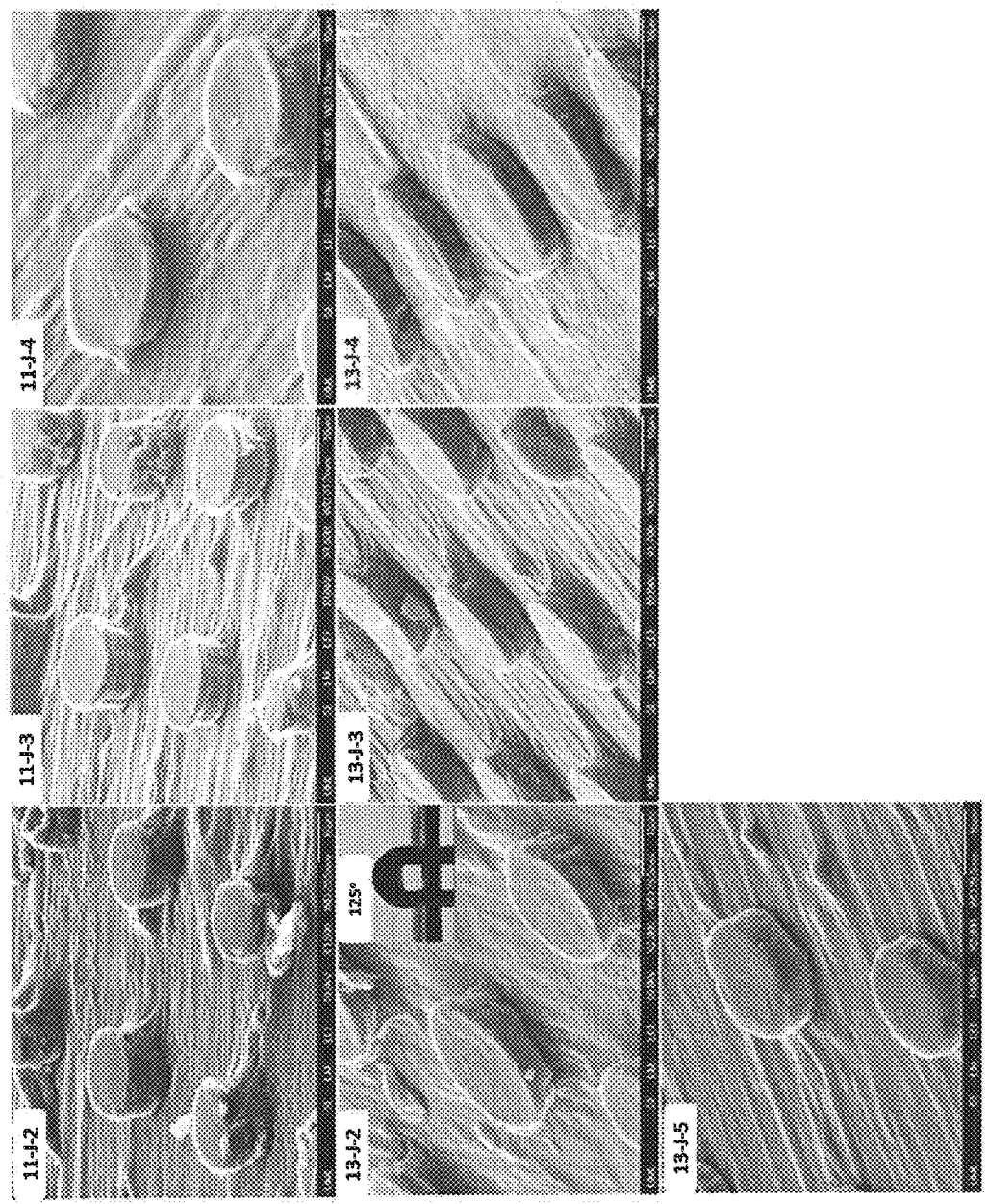
FIGS. 8a-8g show field-emission scanning electron microscopy (FE-SEM) images of fabricated re-entrant structures for an exemplary embodiment of these teachings.

The polymer yielding behavior as predicted from the tensile testing experiment exhibits a similar trend as the storage modulus results (FIG. 3C). The load required to undergo irreversible deformation (yielding) decreases with increase in temperature. The decrease is rapid near $T_g$ and attains a minimum at 150° C. (FIG. 7).

FIGS. 8a-8g show the influence of temperature and pressure (P) on the onset of irreversible deformation (polymer yielding). At temperatures beyond $T_g$ (285° F.) (11-J-3), one can observe polymer yielding at top portion of micron sized pillar structures due to rapid development of creep strains. However, increasing pressure (P) under similar conditions of temperature (13-J-2) resulted in a large extent of polymer yielding. This resulted in smaller geometry angle (Ψ) and higher contact angle for water. But, application of very high pressures (P) and temperature lead to the formation of circular disks rather than re-entrant structures (13-J-3, 13-J-4 & 13-J-5). This may be due to stressing the polymer beyond the yield point resulting in polymer flow and is in accordance with the tensile testing results (see FIG. 7). By considering the yield strength values at appropriate temperature and strain rate suitable re-entrant structures displaying superior water and oil repelling characteristics can be obtained.

After formation of the reentrant structure, the surface can be treated (coated) as in US patent application publication US-2016/0200953-A1, for U.S. patent application Ser. No. 14/542,108, entitled METHODS AND FORMULATIONS FOR SUPERHYDROPHIC, SELF-CLEANING, AND ICEPHOBIC POLYMER COATINGS AND OBJECTS HAVING COATINGS THEREON, and in WIPO Patent application publication no. WO/2015/161233, both of which are incorporated by reference herein in their entirety and for all purposes.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although the teachings have been described with respect to various embodiments, it should be realized these teachings are also capable of a wide variety of further and other embodiments within the spirit and scope of the appended claims.

What is claimed is:

1. A system for mass production, volume manufacturing of reentrant structures, the system comprising:
   a first and second rollers disposed with a gap between them; the gap dimensioned to surround an array of non-curable thermoplastic pillars protruding from a substrate and the substrate; relative rotation of the first and second rollers being configured to draw the array and the substrate through the gap;

at least one temperature adjusting component configured to provide a temperature gradient from a surface of the non-curable thermoplastic pillars disposed farthest away from the substrate to a surface of the substrate; a temperature at the surface of the non-curable thermoplastic pillars disposed farthest away from the substrate being the temperature at which a non-curable thermoplastic material of the non-curable thermoplastic pillars is substantially malleable; the temperature gradient being provided by heating a roller from the first and second rollers, the roller being in contact with the surface of the non-curable thermoplastic pillars disposed farthest away from the substrate, to a first temperature while maintaining another roller from the first and second rollers, the another roller being in contact with the substrate, at a second temperature; a ratio between the first temperature and the second temperature being selected such that nonuniform flow is produced in the non-curable thermoplastic material;

at least one pressure adjusting component configured to apply pressure on the surface of the non-curable thermoplastic pillars disposed farthest away from the substrate; the pressure and the temperature at the surface of the non-curable thermoplastic pillars disposed farthest away from the substrate selected to cause irreversible deformation of the non-curable thermoplastic material; whereby the re-entrant structure is formed;

a driver component configured to drive rotation of the first and second rollers; and a system controller configured to control the driver component, the at least one pressure adjusting component and the temperature adjusting component;

wherein the substrate is of a same material as the array of non-curable thermoplastic pillars;

wherein the system further comprises:
  an apparatus for forming as the array of non-curable thermoplastic pillars, the apparatus comprising:
    third and fourth rollers disposed with a gap between them; the gap dimensioned to surround a sheet of the non-curable thermoplastic material; relative rotation of the first and second rollers being configured to draw the sheet through the gap;

at least one other pressure adjusting component configured to provide a predetermined pressure between third and fourth rollers such that the sheet of the non-curable thermoplastic material is contact with the fourth roller; wherein a flexible mold is disposed on the fourth roller, the flexible mold having an array of apertures and a predetermined thickness, wherein each aperture of the array of apertures has a diameter of 200 nm to 15 um, a height of 400 nm to 15 um, and a center to center spacing of 400 nm to 45 um; and at least one other temperature adjusting component configured to heating at least the fourth roller such that a surface of the sheet of the non-curable thermoplastic material is heated to a temperature at which nonuniform flow is produced; whereby the array of non-curable thermoplastic pillars is formed;

another driver component configured to drive rotation of the third and fourth rollers; and wherein the system controller is also configured to control the another driver component, the at least one other pressure adjusting component and the at least one other temperature adjusting component;

wherein the sheet of the non-curable thermoplastic material is a flexible sheet disposed on a film roll and is configured to be provided to the third and fourth rollers and the first and second rollers in a continuous matter such that continuous rollto-roll processing for forming the array of non-curable thermoplastic pillars and the re-entrant structures.

2. The system of claim 1 wherein the apparatus for forming as the array of non-curable thermoplastic pillars further comprises a preheater component disposed between the film roll and the third and fourth rollers and configured to preheat a portion of the sheet of the non-curable thermoplastic material to a predetermined temperature before moving through the gap; wherein the system controller is also configured to control the preheating component.

* * * * *